US012757558B2

(12) United States Patent
Wu et al.

(10) Patent No.: US 12,757,558 B2
(45) Date of Patent: Oct. 6, 2026

(54) DISPLAY DEVICE AND DRIVING METHOD FOR REDUCING DARK ZONES AROUND FRAME AREA OF DISPLAY SCREEN

(71) Applicant: AUO Corporation, Hsinchu City (TW)

(72) Inventors: Yueh-Chi Wu, Hsinchu City (TW); Chia-Jung Wu, Hsinchu City (TW); Ti-Kuei Yu, Hsinchu City (TW); Ya-Ling Hsu, Hsinchu City (TW)

(73) Assignee: AUO Corporation, Hsinchu City (TW)

( * ) Notice: Subject to any disclaimer, the term of this patent is extended or adjusted under 35 U.S.C. 154(b) by 0 days.

(21) Appl. No.: 18/989,178

(22) Filed: Dec. 20, 2024

(65) Prior Publication Data

US 2026/0096265 A1 Apr. 2, 2026

(30) Foreign Application Priority Data

Sep. 30, 2024 (TW) ................................. 113137403

(51) Int. Cl.

| | |
|---|---|
| ***G09G 3/32*** | (2016.01) |
| ***G09G 3/36*** | (2006.01) |
| ***H10H 29/49*** | (2025.01) |

(52) U.S. Cl.

CPC ............... *H10H 29/49* (2025.01); *G09G 3/32* (2013.01); *G09G 3/3648* (2013.01); *G09G 2300/0426* (2013.01)

(58) Field of Classification Search

CPC .......... G09G 3/30; G09G 3/32; G09G 3/3208; G09G 3/3216; G09G 3/3225; G09G 3/3233; G09G 3/3241; G09G 3/325; G09G 3/3258; G09G 3/36; G09G 3/3611; G09G 3/3614; G09G 3/3622; G09G 3/3625; G09G 3/364; G09G 3/3644; G09G 3/3648; G09G 3/3666; G09G 3/3674; G09G 3/3677; G09G 3/3681; G09G 3/3688; G09G 3/3692

(Continued)

(56) References Cited

U.S. PATENT DOCUMENTS

| | | | | |
|---|---|---|---|---|
| 11,256,121 | B2 | 2/2022 | Zha | |
| 12,566,350 | B2 * | 3/2026 | Wu | G02F 1/1339 |

(Continued)

FOREIGN PATENT DOCUMENTS

| | | | |
|---|---|---|---|
| CN | 110275340 | A | 9/2019 |
| CN | 113281928 | A | 8/2021 |
| CN | 115421326 | A | 12/2022 |

*Primary Examiner* — Ke Xiao
*Assistant Examiner* — Nelson Lam
(74) *Attorney, Agent, or Firm* — WPAT, PC

(57) ABSTRACT

A display device and a method for driving the same are provided. The display device includes a first substrate and a second substrate. The first substrate has a first display unit area including first display units, and a second display unit area, located on a first side of the first display unit area, including second display units. The second display unit is different from the first display unit. The second substrate, at least partially stacked with the first substrate, has a third display unit area including third display units. The method includes: inputting a first signal from a first signal input side of the first substrate to the first display unit; inputting a second signal from the first signal input side to the second display unit; and inputting a third signal from a second signal input side of the second substrate to drive third display units on the second substrate.

19 Claims, 12 Drawing Sheets

(58) Field of Classification Search
USPC ........................................ 345/76–83, 87–104
See application file for complete search history.

(56) References Cited

U.S. PATENT DOCUMENTS

| | | | | |
|---|---|---|---|---|
| 2011/0115693 | A1* | 5/2011 | Kim | H10K 59/128<br>345/76 |
| 2013/0300728 | A1* | 11/2013 | Reichow | G09G 3/003<br>345/419 |
| 2014/0184669 | A1* | 7/2014 | Oh | G09G 3/007<br>345/82 |
| 2016/0240118 | A1* | 8/2016 | Ray | G09G 3/003 |
| 2018/0357952 | A1* | 12/2018 | Yang | H04N 23/60 |
| 2022/0208042 | A1* | 6/2022 | Lim | H04N 13/351 |
| 2023/0206830 | A1* | 6/2023 | Lee | G09G 3/3275<br>345/204 |
| 2024/0127767 | A1* | 4/2024 | Shen | H04N 9/3173 |

* cited by examiner

DISPLAY DEVICE AND DRIVING METHOD FOR REDUCING DARK ZONES AROUND FRAME AREA OF DISPLAY SCREEN

CROSS REFERENCE TO RELATED APPLICATION

This application claims the priority benefits of Taiwan Patent Application No. 113137403, filed on Sep. 30, 2024. The entirety of the mentioned above patent application is hereby incorporated by reference herein and made a part of this specification.

TECHNICAL FIELD

The present disclosure relates to a display device and a method for driving the same, and in particular to a display device with reduced dark zones around a frame of a display screen.

BACKGROUND

With the continuous progress of display technology, the product maturity of various display panels is also increasing. Liquid crystal display panels, organic light-emitting diode (OLED) display panels and micro light-emitting diode (micro LED) display panels have been developed for a long time in technology. However, in the development of large-size display technology, in addition to a single large-size panel to achieve, the use of panel splicing to form a large-size display device is also one of the current mainstream technical trends.

However, since the display area of each individual liquid crystal display panel does not easily cover the entire frame, a user can easily perceive the seams between the liquid crystal display panels when looking at a large-size display device formed by splicing panels. In the prior art, there are attempts to add micro LEDs on an edge of one substrate in a liquid crystal display panel. However, when the micro LEDs are arranged on the lower substrate which already has a liquid crystal pixel control line, the wiring density will be too high, thus affecting the wiring design. When the micro LEDs are arranged on the upper substrate, it may also be difficult to design the circuit due to excessive wiring.

SUMMARY

Technical Means to Solve Problems

In order to solve the above problems, an embodiment of the present disclosure provides a display device, including a first substrate and a second substrate. The first substrate has a first display unit area including a plurality of first display units and a second display unit area including a plurality of second display units. The second display unit area is located on a first side of the first display unit area, and each second display unit is different from each first display unit. The second substrate is at least partially stacked with the first substrate and has a third display unit area including a plurality of third display units. The third display unit area has a vertical projection range on the first substrate at least partially located on a second side of the first display unit area.

Another embodiment of the present disclosure provides a method for driving a display device, including the following steps: inputting a first signal from a first signal input side of a first substrate to at least one of a plurality of first display units on the first substrate; inputting a second signal from the first signal input side of the first substrate to at least one of the plurality of second display units on the first substrate, where each second display unit is different from each first display unit; and inputting a third signal from a second signal input side of a second substrate at least partially overlapped with the first substrate to drive a plurality of third display units on the second substrate, where the second signal input side corresponds to the first signal input side.

Effects as Compared with the Prior Art

Based on the display device and the method for driving the same provided by the embodiments of the present disclosure, wiring and bonding pad densities on individual substrates can be reduced, thereby alleviating the problem of poor yield, reduced aperture ratio or difficulties in circuit signal design due to overhigh wiring density. In addition, according to the technical solutions proposed in some embodiments, display dark zones or display gaps between adjacent display unit areas in different directions can also be filled, thereby improving the image integrity and user experience of the splicing display device.

DETAILED DESCRIPTION

Figure 1:
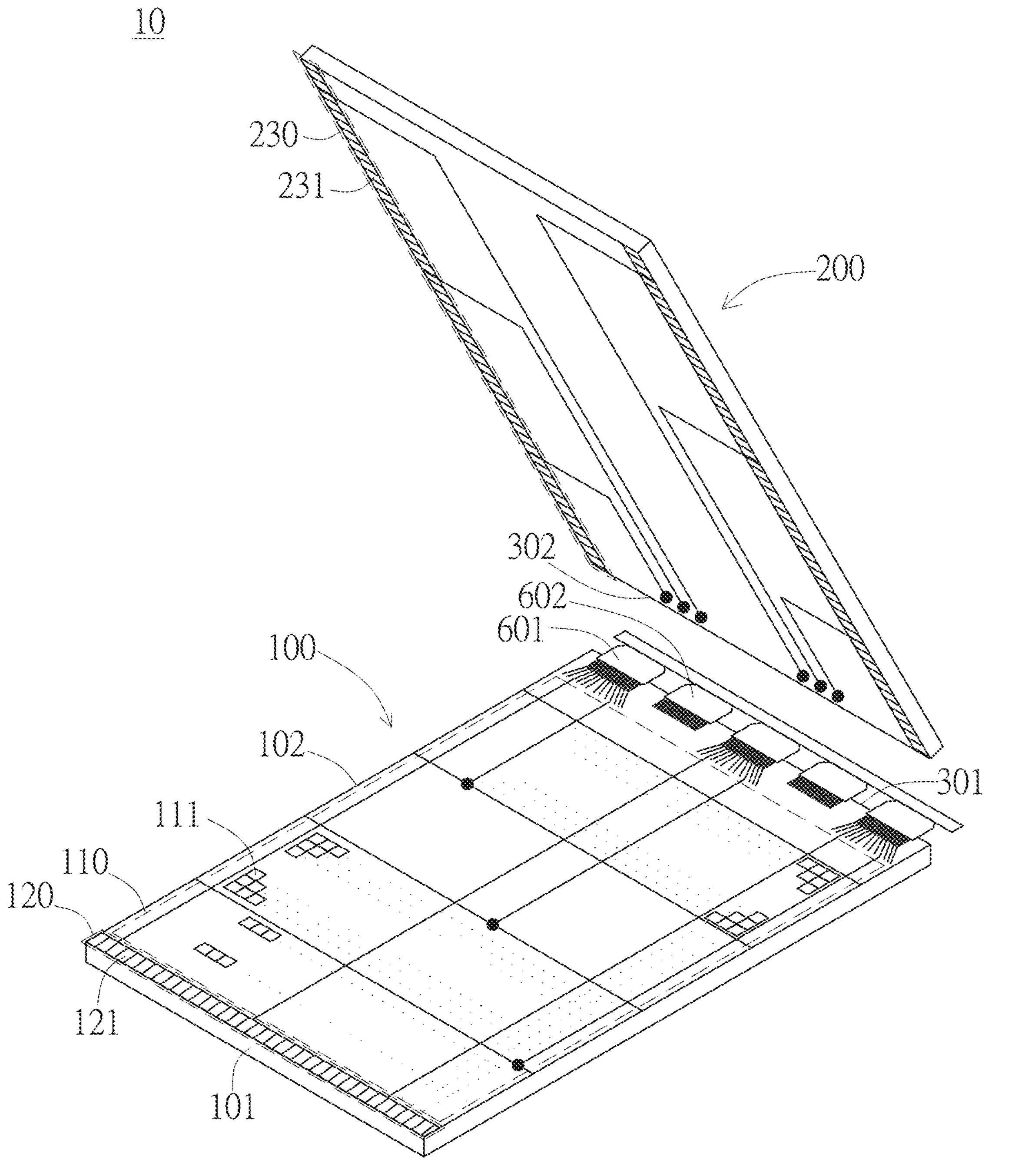
FIG. 1 is a schematic expanded view of a display device according to an embodiment of the present disclosure.

Various embodiments will be described below, and those of ordinary skill in the art can easily understand the spirit and principles of the present disclosure with reference to this specification and the accompanying drawings. However, although some specific embodiments will be specifically described herein, these embodiments are merely exemplary and are not to be regarded as limiting or exhaustive in any respect. Therefore, various changes and modifications of the present disclosure shall be obvious and readily achievable for those of ordinary skill in the art without departing from the spirit and principles of the present disclosure.

In the accompanying drawings, the thicknesses of layers, films, panels, areas, etc. are exaggerated for clarity. Throughout this specification, the same reference signs denote the same elements. It should be understood that when an element such as a layer, film, area or substrate is referred to as being "on" or "connected to" another element, it may be directly on or connected to the another element, or there may be other elements therebetween. On the contrary, when an element is referred to as being "directly on" or "directly connected to" another element, there is no element therebetween. As used herein, "connection" may refer to a physical and/or electrical connection. Further, "electrical connection" or "coupling" can mean that other elements exist between two elements.

The terms used herein are for the purpose of describing specific embodiments only and are not limiting. As used herein, the singular forms "a/an", "one" and "the" are intended to include plural forms, including "at least one", unless the context clearly indicates otherwise. "Or" means "and/or". As used herein, the term "and/or" includes any and all combinations of one or more related listed items. It should also be understood that when used in this specification, the terms "comprising" and/or "including" specifies the presence or addition of the features, areas, integers, steps, operations, elements and/or components, but does not exclude the presence or addition of one or more other features, areas, integers, steps, operations, elements, components and/or combinations thereof.

Exemplary embodiments are described herein with reference to sectional views that are schematic diagrams of idealized embodiments. Thus, variations in the shapes of the illustrations as a result of, for example, manufacturing techniques and/or tolerances can be contemplated. Thus, the embodiments described herein should not be construed as limited to the particular shapes of the areas as illustrated herein, but include, for example, shape deviations caused by manufacturing. For example, areas shown or described as flat may generally have rough and/or non-linear features. Furthermore, the acute angles shown may be round. Therefore, the areas shown in the figures are schematic in nature, and their shapes are not intended to illustrate the precise shapes of the areas and are also not intended to limit the scope of the claims.

Figure 2:
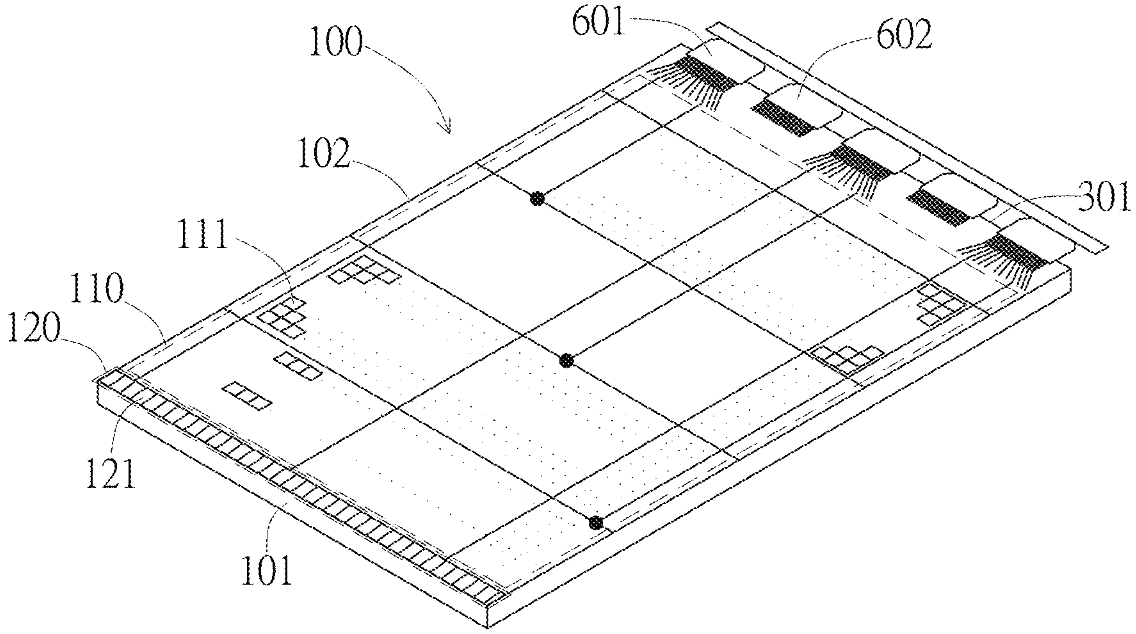
FIG. 2 is a schematic diagram of a first substrate according to the embodiment shown in FIG. 1.

FIG. 1 shows an embodiment of a display device. In this embodiment, the display device 10 has a first substrate 100 and a second substrate 200. The first substrate 100 and the second substrate 200 are at least partially stacked with each other. In this embodiment, the first substrate 100 and the second substrate 200 are both made of a transparent material. Besides, a surface of the second substrate 200 opposite to the first substrate 100 is a display surface of the display device. As shown in FIG. 1 and FIG. 2, the first substrate 100 has a first display unit area 110 and a second display unit area 120, and the second display unit area 120 is located on a first side 101 of the first display unit area 110. Specifically, in this embodiment, the first display unit area 110 is located in a central area of the first substrate 100, and the first side 101 where the second display unit area 120 is located is a side of the first display unit area 110 opposite to a first signal input side 301. However, in a different embodiment, the first side 101 may also be a side perpendicular to the first signal input side 301. Besides, the first display unit area 110 preferably covers the main area of the first substrate 100 except near the edge. The second display unit area 120 is preferably distributed in a strip along the first side 101.

The elements in the drawings, such as display units (first, second and third) and signal lines, are exemplary representatives, and are presented in a simplified way to facilitate understanding. Their quantities can be adjusted according to the actual demand and are not limited by the numbers shown in the drawings, which is hereby explained.

As shown in FIG. 1 and FIG. 2, the first display unit area 110 includes a plurality of first display units 111. In this embodiment, each first display unit 111 is a pixel of a liquid crystal display panel, which may include multiple sub-pixels. However, in a different embodiment, each first display unit 111 may also be an OLED, a micro LED or another different self-luminous or non-self-luminous display unit. The second display unit area 120 includes a plurality of second display units 121 different from the first display units 111. In this embodiment, each second display unit 121 is a micro LED, which may have different colors, such as red, green and blue. However, in a different embodiment, each second display unit 121 may also be an OLED or another different self-luminous or non-self-luminous display unit.

Figure 3:
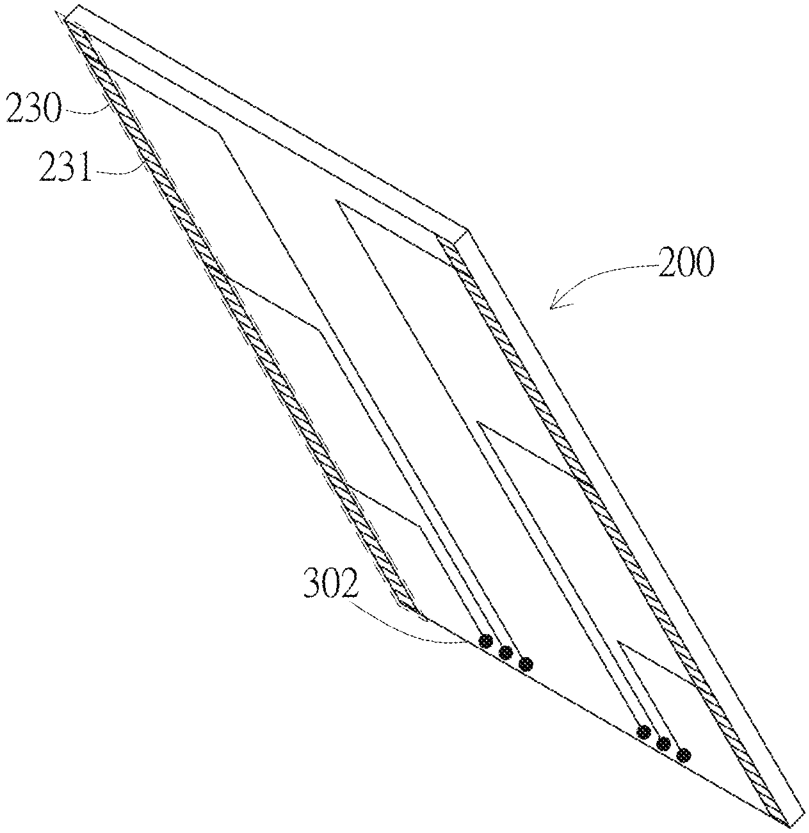
FIG. 3 is a schematic diagram of a second substrate according to the embodiment shown in FIG. 1.
Figure 4:
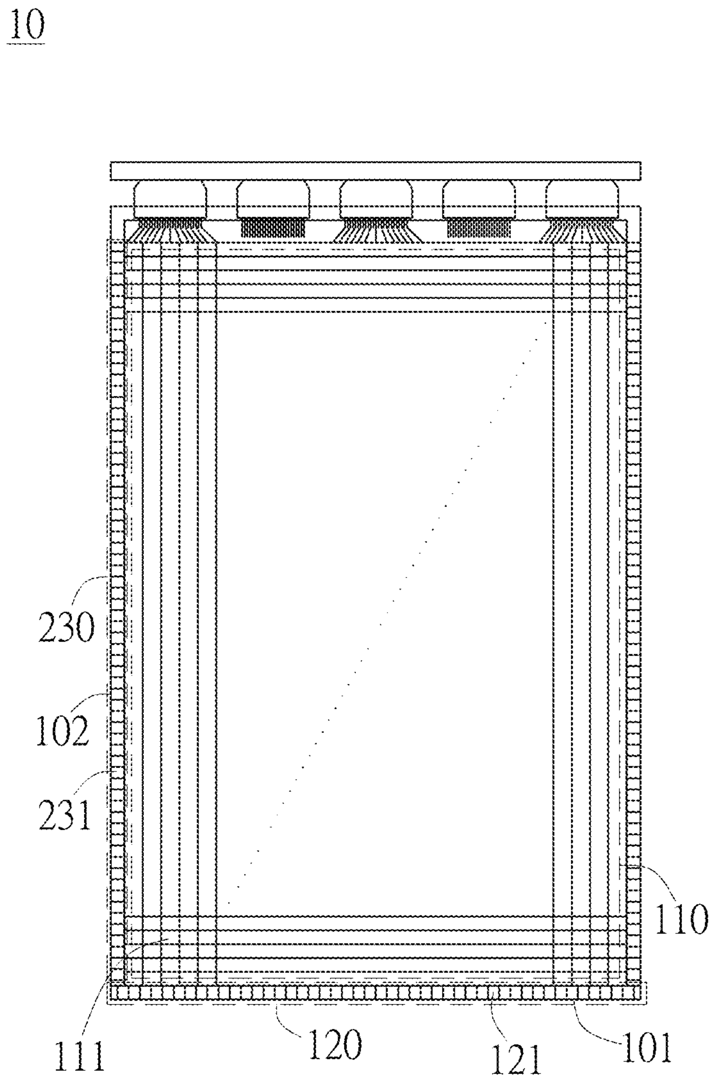
FIG. 4 is a schematic top view of the embodiment shown in FIG. 1.

As shown in FIG. 1 and FIG. 3, the second substrate 200 has a third display unit area 230. In this embodiment, the third display unit area 230 is distributed in a strip and located on a side edge of the second substrate 200. As shown in FIG. 4, when the first substrate 100 and the second substrate 200 are stacked, a vertical projection range of the third display unit area 230 on the first substrate 100 is at least partially located on a second side 102 of the first display unit area 110, and the second display unit area 120 does not overlap with the vertical projection range of the third display unit area 230 on the first substrate 100. In this embodiment, two ends of the second side 102 are respectively connected to the first side 101 and the first signal input side 301 that are opposite to each other. However, in a different embodiment, the positions of the first side 101 and the second side 102 may also be reversed.

The third display unit area 230 includes a plurality of third display units 231. Each third display unit 231 is a micro LED, which may have different colors, such as red, green and blue. However, in a different embodiment, each third display unit 231 may also be an OLED or another different self-luminous or non-self-luminous display unit. Besides, in this embodiment, the second display units 121 and the third display units 231 are the same type of light-emitting display units. However, in a different embodiment, they may be different types of display units.

Figure 5:
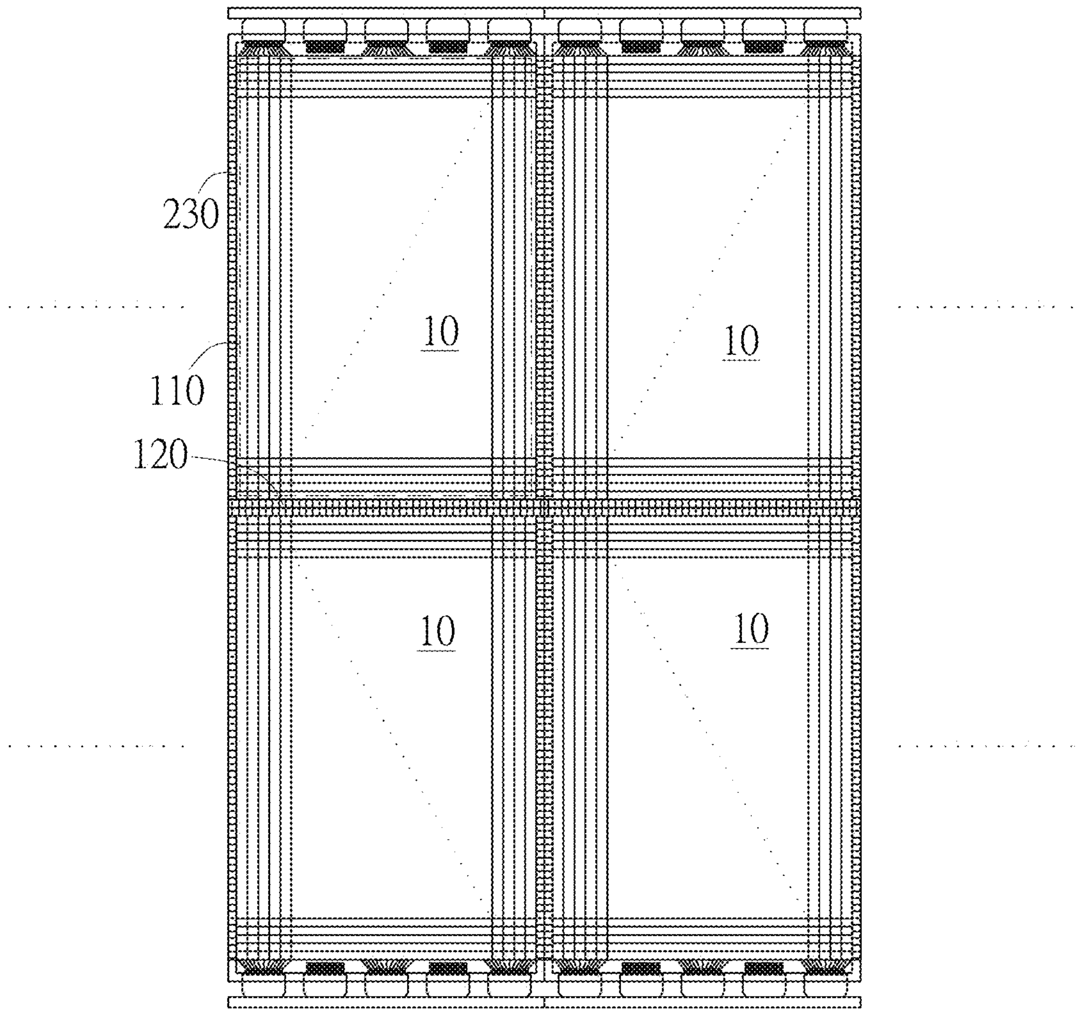
FIG. 5 is a schematic diagram of an embodiment of splicing of a plurality of display devices.

In the embodiment shown in FIG. 4, when the first substrate 100 and the second substrate 200 are stacked, the second display unit area 120 and a vertical projection range of the third display unit area 230 on the first substrate 100 are respectively located on different side edges of the first display unit area 110. That is, the second display unit area 120 and the third display unit area 230 are located on the edges of the whole display device. Therefore, when a plurality of display devices 10 are connected side-by-side with each other, as shown in FIG. 5, the second display unit area 120 and the third display unit area 230 may be respectively located between the first display unit areas 110 of the adjacent display devices 10 in different directions to fill display dark zones or display gaps between the adjacent first display unit areas 110 in different directions, thereby improving the image integrity and user experience of the splicing display device.

Figure 6:
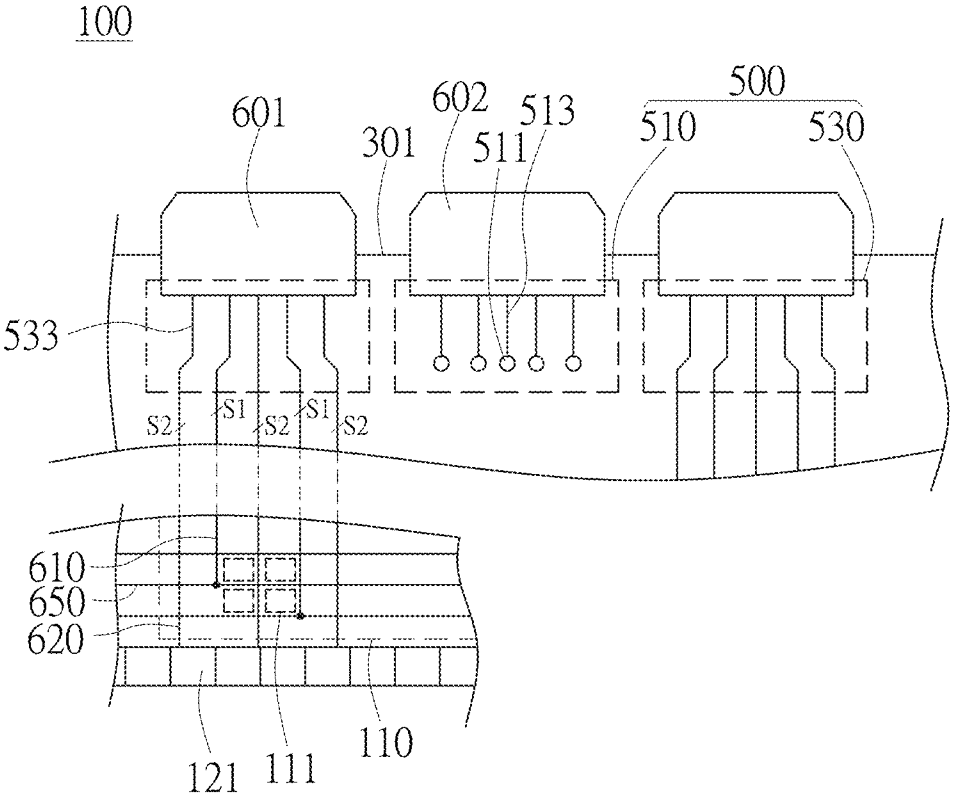
FIG. 6 is a schematic diagram of an embodiment of the first substrate.

FIG. 6 is a schematic diagram of an embodiment of the first substrate 100. As shown in FIG. 6, the first substrate 100 has the first signal input side 301 and a sector connection area 500 distributed along the first signal input side 301. The sector connection area 500 has a first transfer block 510 and a signal input block 530 arranged at an interval. In this embodiment, the first transfer block 510 and the signal input block 530 are respectively formed by a plurality of wires 513 and a plurality of wires 533 in parallel, and an end of each wire 513 or 533 close to an end edge of the first substrate 100 has a bonding pad. An end of each wire 513 in the first transfer block 510 opposite to the end edge of the first substrate 100 has a first transfer pad 511. As shown in FIG. 6, the first transfer pad 511 is located between the first display unit area 110 and the first signal input side 301, that is, it does not enter the valid display area formed by the first display unit area 110. An end of each wire 533 in the signal input block 530 opposite to the first signal input side 301 extends toward the inside of the first substrate 100 to form a first signal line 610 and a second signal line 620, which are respectively electrically connected to each first display unit 111 and each second display unit 121, so as to respectively control or drive each first display unit 111 and each second display unit 121. The bonding pads, transfer pads, conductive pads or similar terms used herein may be directly formed with the ends of the wires. However, in a different embodiment, they may also be formed by other additionally-connected conductive elements such as pads and solder pads.

In the embodiment shown in FIG. 6, the first substrate 100 is provided with a plurality of gate signal lines 650 respectively corresponding to the first display units 111 in different columns. These gate signal lines 650 are arranged in parallel and respectively extend along a direction transverse to the first signal lines 610 (for example, parallel to the first signal input side 301). These gate signal lines 650 are located on a different metal layer from the first signal lines 610, but each gate signal line 650 is respectively electrically connected to each first signal line 610, for example, through a via. In this way, a signal transmitted by each first_signal line 610 can be transmitted to the first display units 111 in the corresponding column through the corresponding gate signal line 650.

As shown in FIG. 6, the display device further has a first driving signal source 601 and a second driving signal source 602. The first driving signal source 601 and the second driving signal source 602 are respectively electrically connected to the signal input block 530 and the first transfer block 510, for example, respectively connected to the bonding pads of the wires 533 and 513. The first driving signal source 601 provides a driving signal to the first display units 111 and the second display units 121, and the second driving signal source 602 provides a driving signal to the third display units 231. For example, the first driving signal source 601 may provide a gate signal, which is respectively transmitted to the first display units 111 in the corresponding columns through the first signal lines 610 and the gate signal lines 650. The first driving signal source 601 may also provide a driving signal, which is respectively transmitted to the corresponding second display units 121 through the second signal lines 620 to control the lighting of the second display units 121. Besides, in this embodiment, the first driving signal source 601 and the second driving signal source 602 are made of Chip on film (COF) elements, but are not limited thereto, for example, they may be made of Chip on glass (COG) or other methods.

Figure 7:
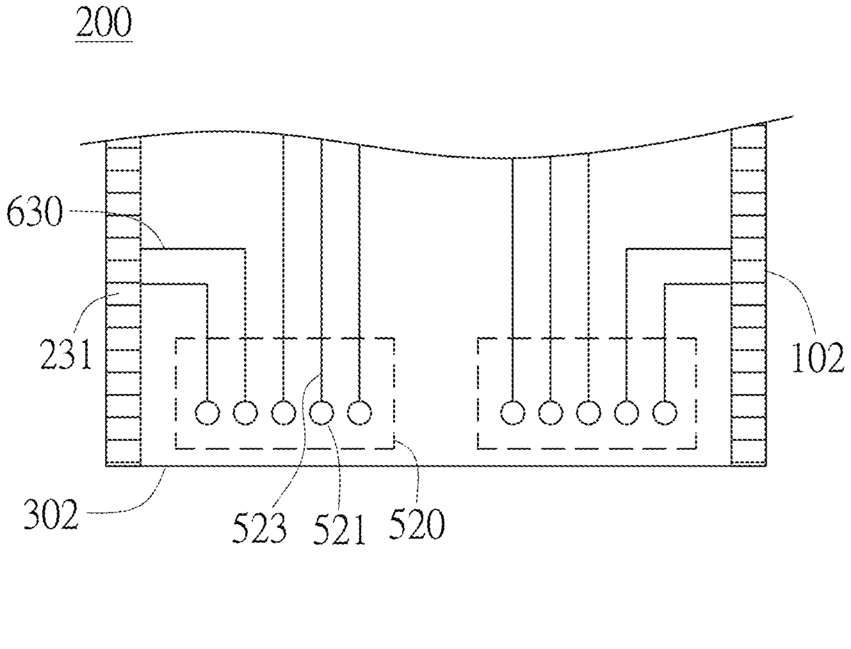
FIG. 7 is a schematic diagram of an embodiment of the second substrate.

FIG. 7 is a schematic diagram of an embodiment of the second substrate 200. As shown in FIG. 7, the second substrate 200 has a second signal input side 302 corresponding to the first signal input side 301 and at least one second transfer block 520 distributed along the second signal input side 302. The corresponding relationship between the first signal input side 301 and the second signal input side 302 includes, but not limited to, the first signal input side 301 and the second signal input side 302 being located on the same side of the display device, or respectively located at opposite positions when the first substrate 100 and the second substrate 200 are stacked. In this embodiment, the second transfer block 520 is formed by a plurality of wires 523 in parallel, and an end of each wire 523 close to an end edge of the second substrate 200 has a second transfer pad 521. The other end of the wire 523 extends to the inside of the second substrate 200 to form a third signal line 630, which is respectively electrically connected to each third display unit 231 to control or drive the third display unit 231.

In the embodiment shown in FIG. 7, the second side 102 where the third display unit area 230 is located is perpendicular to the second signal input side 302, so the third signal lines 630 extend from the second signal input side 302, then bend (for example, by 90 degrees) and extend toward the third display unit area 230, and the third signal lines 630 can be located in the same metal layer all the way without transferring to another layer. However, in a different embodiment, the third signal lines 630 may also transfer to another layer, for example, the longitudinal and transverse lines are arranged in different layers and then connected through vias. In a different embodiment, when the second side 102 is arranged on an opposite side of the second signal input side 302, the third signal lines 630 may also be arranged in a different way, for example, without bending. Besides, when the first substrate 100 and the second substrate 200 are stacked, a projection range of the third signal line 630 on the first substrate 100 may be located at or near the boundary of the first display units 111, or between the adjacent first display units 111, so as to reduce the influence on the overall aperture ratio of the display device.

Figure 8:
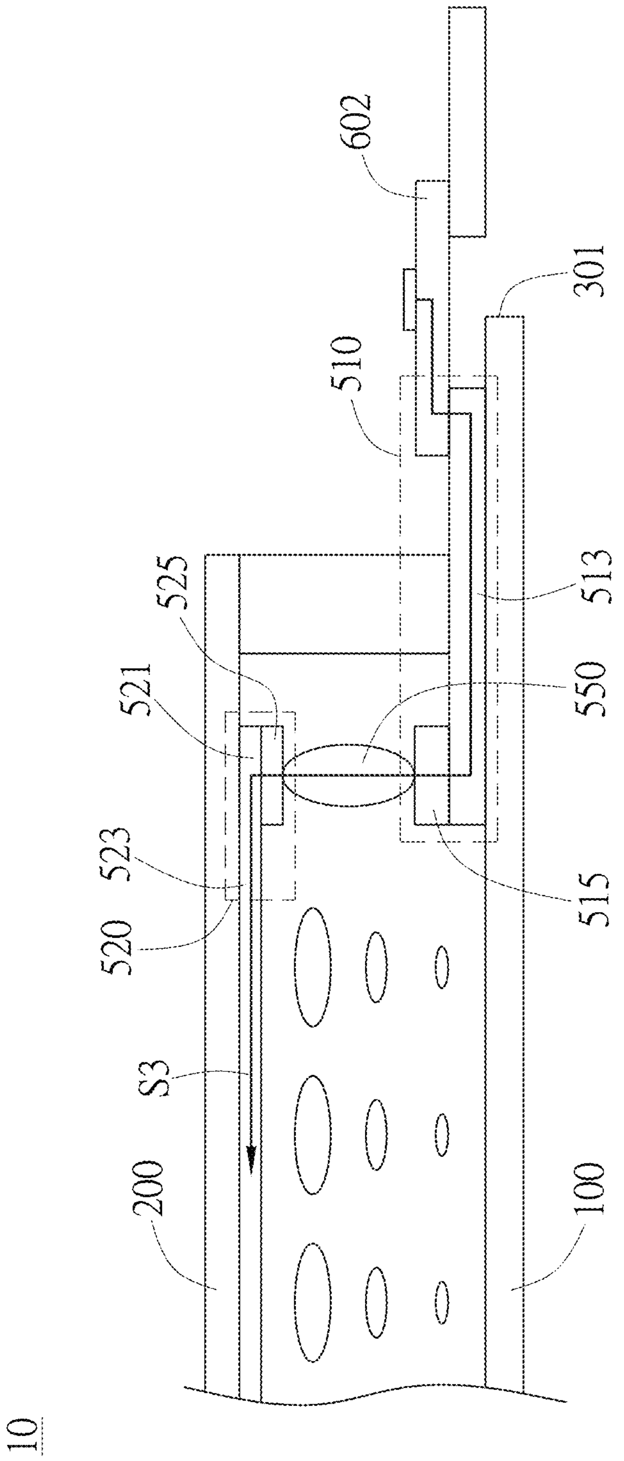
FIG. 8 is a schematic sectional view of an embodiment of the display device.

FIG. 8 is a sectional view of an embodiment in which the first substrate 100 and the second substrate 200 are stacked. As shown in FIG. 8, the first transfer block 510 and the second transfer block 520 are opposite to each other, such that each first transfer pad 511 and each second transfer pad 521 are electrically connected to each other so as to perform inter-substrate signal transmission. Specifically, in this embodiment, a gold particle layer 550 is arranged between the first transfer block 510 and the second transfer block 520, and a first conductive pad 515 is disposed on each first transfer pad 511, and a second conductive pad 525 is disposed on each second transfer pad 521. Each first conductive pad 515 and each second conductive pad 525 are respectively connected to upper and lower ends of the gold particle layer 550 so as to form electrical connection between the first transfer pad 511 and the second transfer pad 521. The first conductive pads 515 and the second conductive pads 525 may be preferably formed of indium tin oxide (ITO). Besides, as shown in FIG. 6, the gold particle layer 550 may be distributed in a ribbon and extend along the first signal input side 301, and may span the first transfer block 510 and the signal input block 530 arranged at an interval. As described above, the first transfer pads 511 and the second transfer pads 521 may be directly formed by the ends of the wires 513 and the wires 523, instead of additional bonding pads. However, in a different embodiment, the first transfer pads 511 and the second transfer pads 521 may be bonding pads added to the ends of the wires 513 and the wires 523.

Figure 9:
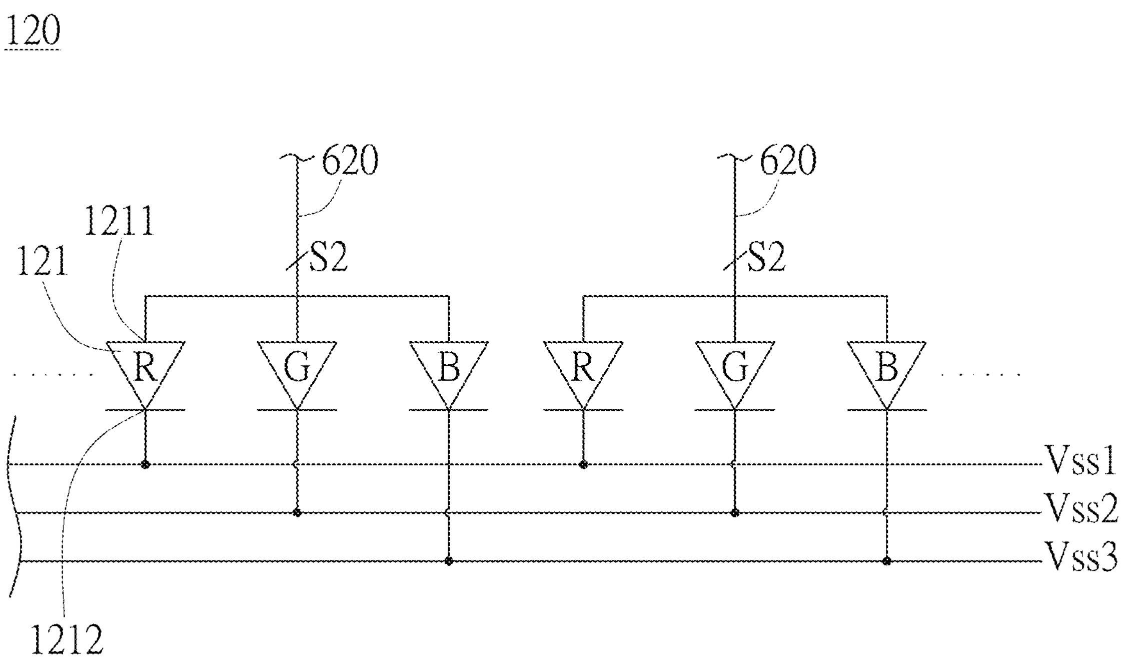
FIG. 9 is a schematic diagram of an embodiment of a second display unit area.

FIG. 9 is an embodiment of the second display unit area 120. In this embodiment, each second signal line 620 is electrically connected to a first end 1211 of each of three second display units 121. In this embodiment, the three second display units 121 connected to the same second signal line 620 are respectively micro LEDs with three different colors, namely red, green and blue, and the first ends 1211 are P terminals of the second display units 121. Second ends of the three second display units 121 are N terminals that are respectively electrically connected to different common voltage sources Vss1-Vss3. In other words, every three second display units 121 (for example, red, green and blue respectively) form a group, each group is connected to one second signal line 620, and the lines of the three common voltage sources Vss1-Vss3 are connected to different second display units 121 in each group. This can reduce the number of second signal lines 620 required so as to reduce the difficulty in circuit design and wiring, and can improve the aperture ratio and process yield. Particularly, this can reduce the number of lines used when the first signal input side 301 is a short side of the first substrate 100 as there is limited wiring space.

Figure 10:
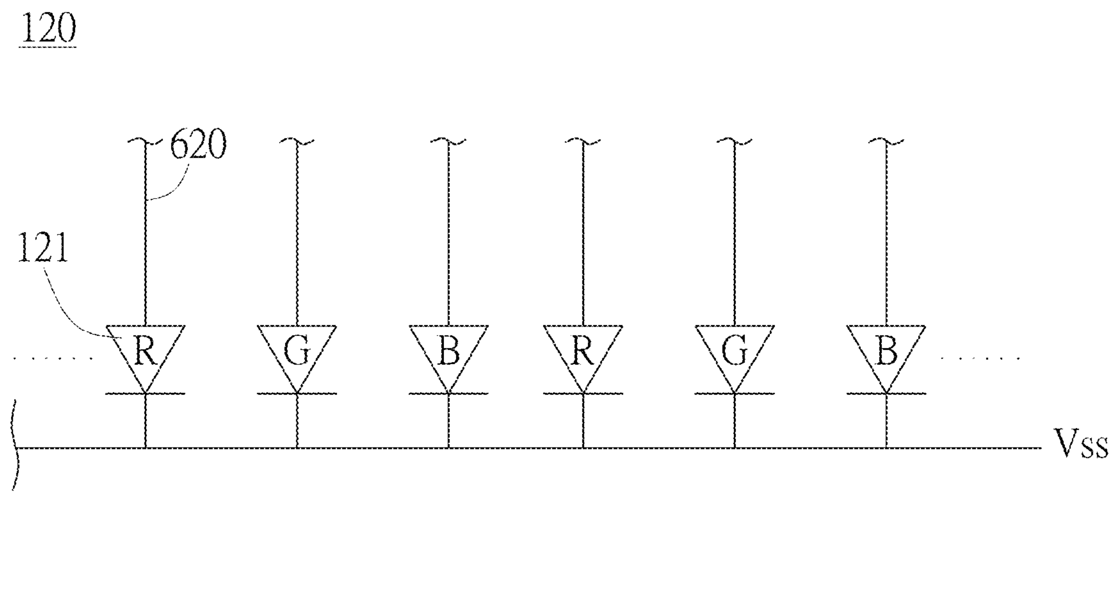
FIG. 10 is a schematic diagram of another embodiment of the second display unit area.

The line configuration shown in FIG. 9 above may also be used in the wiring design of the third display units 231 on the second substrate 200 as required. However, in a different embodiment, such as the embodiment shown in FIG. 10, different second signal lines 620 may also be respectively electrically connected to different second display units 121, and these second display units 121 are respectively electrically connected to the same line of a common voltage source Vss. For example, this design may be used when the first signal input side 301 is a long side of the first substrate 100 as there is abundant wiring space.

Figure 11:
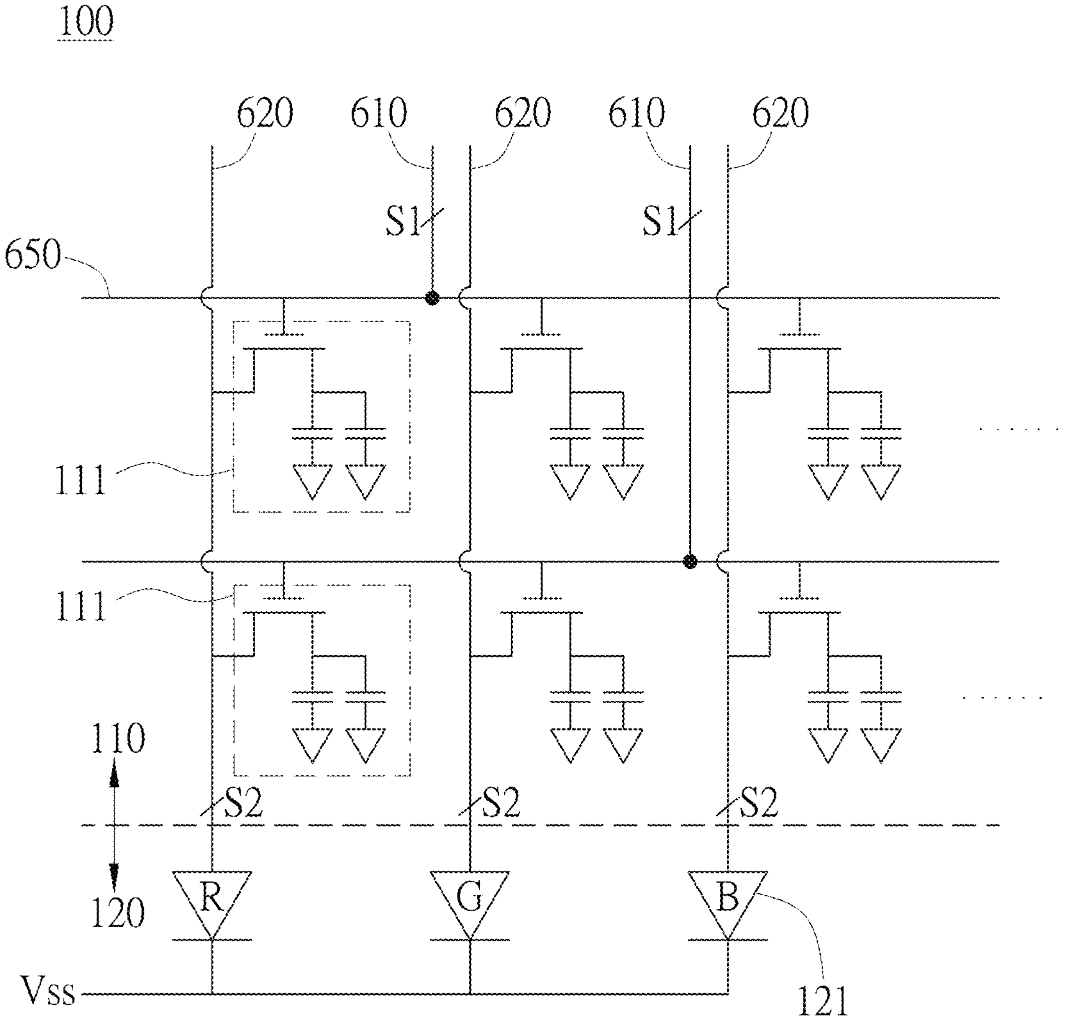
FIG. 11 is a schematic diagram of another embodiment of the first substrate.

FIG. 11 shows another embodiment of the first substrate 100. As shown in FIG. 11, the second signal line 620 not only provides the display driving signal to the second display units 121, but also respectively provides a display driving signal (i.e., a display data signal) to each of the first display units 111 in the same row in a chronological order. In other words, the second display units 121 and the first display units 111 share a common data signal line, and the first driving signal source 601 provides a driving signal to the second display units 121 at blanking time between the display of two consecutive frames provided to the first display unit area 110. The blanking time is much shorter than a display time of one frame of the first display unit area 110, for example, the blanking time may be only 7.7%-12.2% of a complete frame time (i.e., the blanking time plus the display time of the first display unit area 110). Therefore, a sufficient display brightness of the second display units 121 can be maintained by increasing the current supplied to the second display units 121. Through the design in which the second display units 121 and the first display unit 111 share a common data signal line, longitudinal lines on the first substrate 100 can be reduced, so the extra space can be used to increase the number of longitudinal gate signal lines in the wiring design, so as to increase the charging rate of the first display units 111.

Figure 12A:
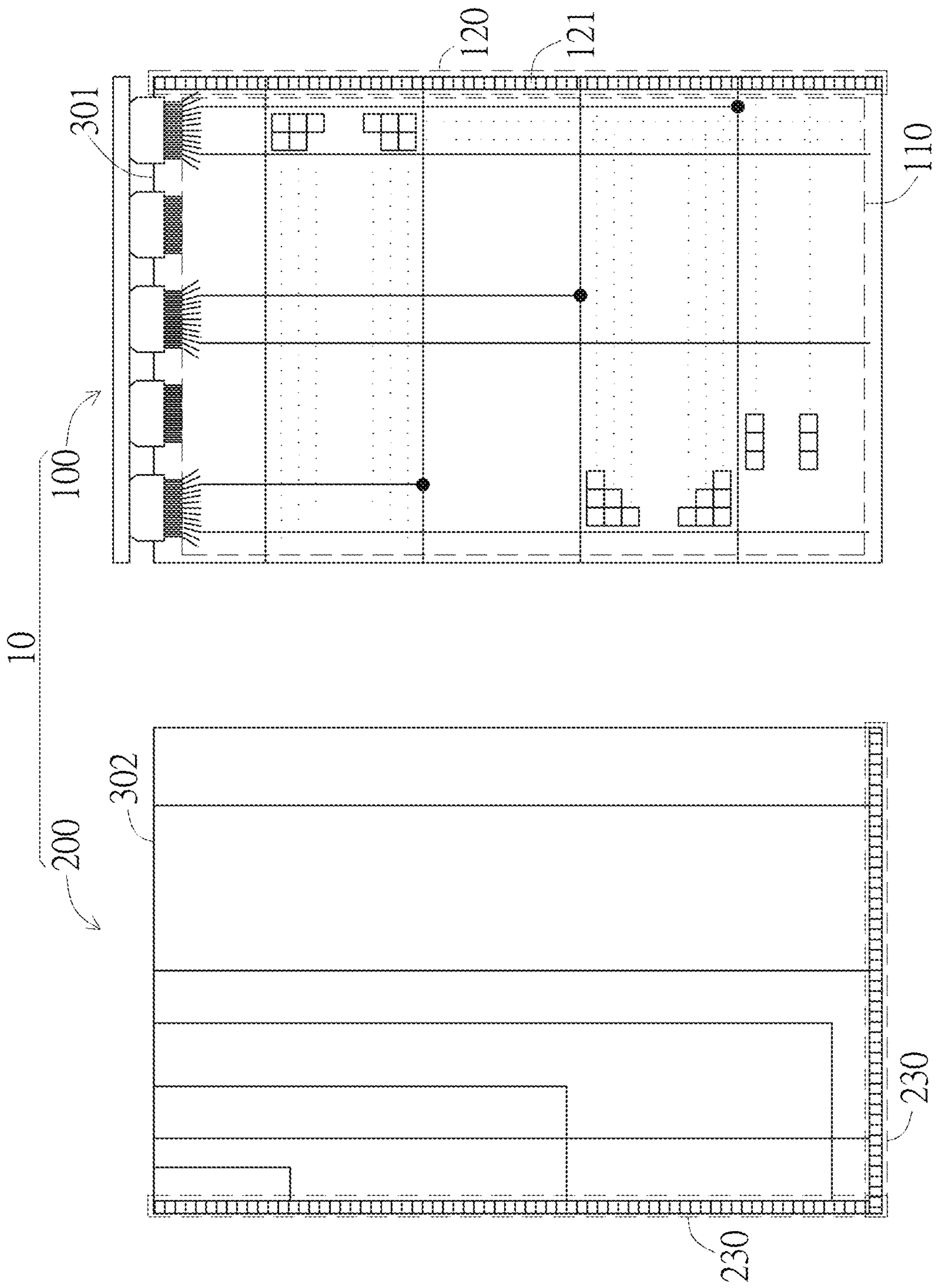
FIG. 12A is a schematic diagram of another embodiment of the display device.
Figure 12B:
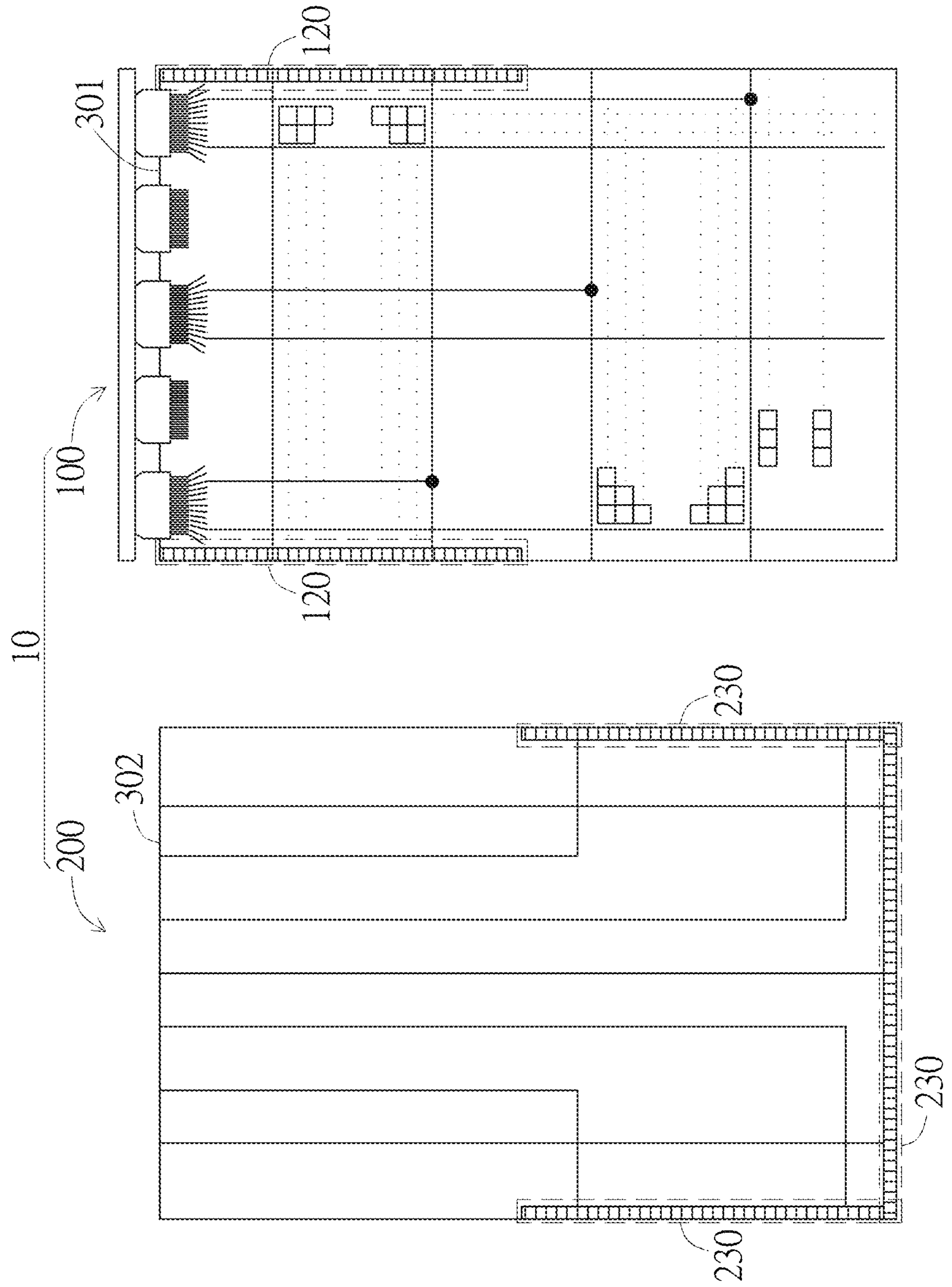
FIG. 12B is a schematic diagram of another embodiment of the display device.

FIG. 12A and FIG. 12B respectively show variant embodiments of the display device 10. In FIG. 12A, on the first substrate 100, the second display unit area 120 may be arranged on a side perpendicular to the first signal input side 301. On the second substrate 200, the third display unit area 230 is arranged not only on a side perpendicular to the second signal input side 302, but also a side opposite to the second signal input side 302. By reducing the number of the second display units 121 on the first substrate 100, the number of the second signal lines 620 can be reduced at the same time, thereby improving the aperture ratio of the display device.

In addition, in the embodiment shown in FIG. 12B, on the first substrate 100, the second display units area 120 may be arranged on a side perpendicular to the first signal input side 301, or only near the first signal input side 301, so as to reduce the signal delay. On the second substrate 200, the third display unit area 230 is arranged on both a side edge perpendicular to and a side edge opposite to the second signal input side 302, and is located far away from the second signal input side 302. Due to a long wiring distance between the second signal input side 302 and the third display unit area 230, a larger line width can be adopted to reduce the signal delay. Due to the low wiring and element densities on the second substrate 200, there are few restrictions when adopting the larger line width design.

Figure 13:
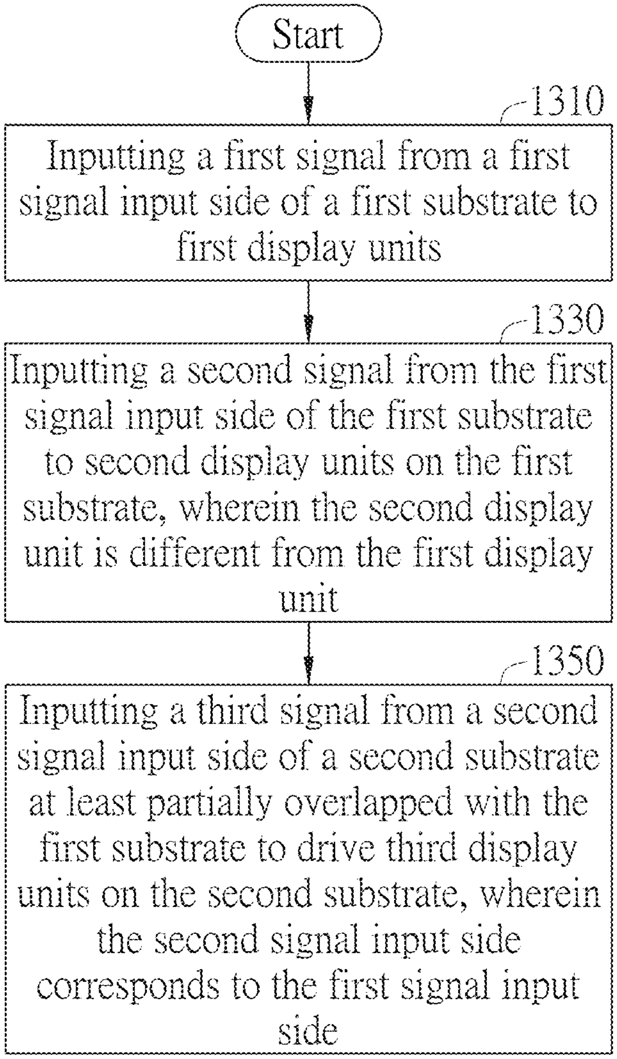
FIG. 13 is a flowchart of an embodiment of a method for driving a display device.

FIG. 13 is a flowchart of an embodiment of a method for driving a display device according to the present disclosure. As shown in FIG. 13 and FIG. 6, the method includes steps as follows. Step 1310 includes inputting a first signal S1, for example, a gate control signal, from a first signal input side 301 of a first substrate 100 to first display units 111. Step 1330 includes inputting a second signal S2 from the first signal input side 301 to second display units 121 on the first substrate, wherein each second display unit 121 is different from each first display unit 111. In an embodiment, as shown in FIG. 9, this step includes inputting the same second signal S2 to a first end 1211 of each of the three second display units 121; and electrically connecting a second end 1212 of each of the three second display units 121 to a different common voltage source Vss1-Vss3. In another embodiment, as shown in FIG. 11, a display driving signal is provided to the first display units 111 and the second signal S2 is provided to the second display units 121, respectively, in a chronological order through a same signal path.

Step 1350 includes inputting a third signal S3 from a second signal input side 302 of a second substrate 200 at least partially overlapped with the first substrate 100 to drive third display units 231 on the second substrate 200, where the second signal input side 302 corresponds to the first signal input side 301, as shown in FIG. 7. In an embodiment, as shown in FIG. 8, this step may include inputting the third signal S3 from the first signal input side 301; and performing inter-substrate signal transmission between a first transfer block 510 of the first signal input side 301 and a second transfer block 520 of the second signal input side 302 so as to transmit the third signal S3 to the second signal input side 302.

The above description is merely some preferred embodiments of the present disclosure. It should be noted that various changes and modifications can be made without departing from the spirit and principles of the present disclosure. It should be understood by those of ordinary skill in the art that the present disclosure is defined by the scope of the appended claims, and all possible substitutions, combinations, modifications, conversions and other changes are within the scope of the present disclosure as defined by the scope of the appended claims.

What is claimed is:

1. A display device, comprising:

a first substrate, comprising:

a first display unit area, comprising a plurality of first display units;

a second display unit area, at least partially located on a first side of the first display unit area and comprising a plurality of second display units, wherein each of the plurality of second display units is of a display mechanism different from each of the plurality of first display units;

a plurality of first signal lines, respectively extending from a first signal input side of the first substrate and respectively electrically connected to at least one of the plurality of first display units; and a plurality of gate signal lines, located on a different layer from the plurality of first signal lines and respectively extending in a direction transverse to the plurality of first signal lines, wherein each of the plurality of first signal lines is respectively electrically connected to one of the plurality of gate signal lines and then a portion of the plurality of first display units arranged along the corresponding one of the plurality of gate signal lines; and a second substrate, at least partially stacked with the first substrate and comprising:

a third display unit area, comprising a vertical projection range on the first substrate at least partially located on a second side of the first display unit area, wherein the third display unit area comprises a plurality of third display units, wherein the vertical projection range of the third display unit area is not overlapped with the second display unit area, and the first side and the second side are respectively located on different edges of the first substrate, wherein the first substrate and the second substrate are connected with each other to perform inter-substrate signal transmission from the first signal input side to a second signal input side of the second substrate, and the second signal input side is disposed corresponding to the first signal input side.

2. The display device of claim 1, wherein the first substrate further comprises a sector connection area distributed along the first signal input side, the sector connection area comprising at least one first transfer block; and the second substrate comprises at least one second transfer block distributed along the second signal input side, the first transfer block comprises a plurality of first transfer pads, the second transfer block comprises a plurality of second transfer pads, wherein the plurality of first transfer pads are respectively electrically connected to the plurality of second transfer pads so as to perform inter-substrate signal transmission from the first signal input side to the second signal input side.

3. The display device of claim 2, further comprising a first driving signal source and a second driving signal source, wherein the sector connection area comprises at least one signal input block arranged at an interval from the at least one first transfer block; and the first driving signal source is electrically connected to the signal input block, and the second driving signal source is electrically connected to the first transfer block.

4. The display device of claim 1, wherein the first signal input side and the first side are opposite sides of the first display unit area, and two ends of the second side are respectively connected to the first side and the first signal input side.

5. The display device of claim 4, wherein the first substrate further comprises:

a plurality of second signal lines, respectively extending from the first signal input side and respectively electrically connected to at least one of the plurality of second display units.

6. The display device of claim 5, wherein each of the plurality of second signal lines is electrically connected to a first end of each of three of the plurality of second display units, and a second end of each of the three of the plurality of second display units is connected to a different common voltage source.

7. The display device of claim 5, wherein each of the plurality of second signal lines is electrically connected to the plurality of first display units simultaneously so as to respectively provide the plurality of first display units with a display driving signal and provide at least one of the plurality of second display units with another display driving signal in a chronological order.

8. A splicing display device, comprising a plurality of the display devices of claim 1 connected side-by-side with each other, wherein the second display unit area or the third display unit area of adjacent ones of the display devices are located between the first display unit areas of the adjacent ones of the display devices.

9. A display device, comprising:

a first substrate, comprising a first signal input side, wherein the first substrate comprises:

a plurality of first display units;

a plurality of first signal lines, respectively extending from the first signal input side and respectively electrically connected to at least one of the plurality of first display units;

a plurality of gate signal lines, located on a different layer from the plurality of first signal lines and respectively extending in a direction transverse to the plurality of first signal lines, wherein each of the plurality of first signal lines is respectively electrically connected to one of the plurality of gate signal lines and then a portion of the plurality of first display units arranged along the corresponding one of the plurality of gate signal lines;

a plurality of second display units, wherein each of the plurality of second display units is of a display mechanism different from each of the plurality of first display units; and a plurality of second signal lines, respectively extending from the first signal input side and respectively electrically connected to at least one of the plurality of second display units; and a second substrate, at least partially stacked with the first substrate and comprising a second signal input side corresponding to the first signal input side to perform inter-substrate signal transmission from the first signal input side to the second signal input side, wherein the second substrate comprises:

a plurality of third display units; and a plurality of third signal lines, respectively extending from the second signal input side and respectively electrically connected to at least one of the plurality of third display units, wherein a vertical projection range of the plurality of third display units on the first substrate is not overlapped with the plurality of second display units.

10. The display device of claim 9, wherein the first substrate comprises a sector connection area distributed along the first signal input side, the sector connection area comprising at least one first transfer block; and the second substrate comprises at least one second transfer block distributed along the second signal input side, the first transfer block being electrically connected to the second transfer block so as to perform inter-substrate signal transmission from the first signal input side to the second signal input side.

11. The display device of claim 10, further comprising a first driving signal source and a second driving signal source, wherein the sector connection area comprises at least one signal input block arranged at an interval from the at least one first transfer block; and the first driving signal source is electrically connected to the signal input block, and the second driving signal source is electrically connected to the first transfer block.

12. The display device according to claim 9, wherein each of the plurality of second signal lines is electrically connected to a first end of each of three of the plurality of second display units, and a second end of each of the three of the plurality of second display units is connected to a different common voltage source.

13. The display device of claim 9, wherein each of the plurality of second signal lines is electrically connected to the plurality of first display units simultaneously so as to respectively provide the plurality of first display units with a display driving signal and provide the at least one of the plurality of second display units with another display driving signal in a chronological order.

14. A splicing display device, comprising a plurality of the display devices of claim 9 connected side-by-side with each other, wherein the second display unit area or the third display unit area of adjacent ones of the plurality of display devices are located between the first display unit areas of the adjacent ones of the display devices.

15. A method for driving a display device, comprising the following steps:

inputting a first signal from a first signal input side of a first substrate through a first signal line and then through a gate signal line extending in a direction transverse to the first signal line to a portion of a plurality of first display units arranged along the gate signal line on the first substrate;

inputting a second signal from the first signal input side of the first substrate to at least one of a plurality of second display units on the first substrate, wherein each of the plurality of second display units is of a display mechanism different from each of the plurality of first display units; and inputting a third signal from the first signal input side and performing inter-substrate signal transmission between the first signal input side and a second signal input side of a second substrate at least partially overlapped with the first substrate so as to transmit the third signal to the second signal input side to drive a plurality of third display units on the second substrate, wherein the second signal input side corresponds to the first signal input side, and a vertical projection range of the plurality of third display units on the first substrate is not overlapped with the plurality of second display units.

16. The method of claim 15, wherein the step of inputting the third signal comprises:

inputting the third signal from the first signal input side; and performing inter-substrate signal transmission between a first transfer block of the first signal input side and a second transfer block of the second signal input side so as to transmit the third signal to the second signal input side.

17. The method of claim 15, wherein the step of inputting the first signal comprises inputting a gate control signal as the first signal.

18. The method of claim 15, wherein the step of inputting the second signal comprises:

inputting the same second signal to a first end of each of three of the plurality of second display units; and electrically connecting a second end of each of the three of the plurality of second display units to a different common voltage source.

19. The method of claim 15, wherein the step of inputting the second signal comprises respectively providing at least one of the plurality of first display units with a display driving signal and providing the at least one of the plurality of second display units with the second signal in a chronological order through a same signal path.

* * * * *